United States Patent [19]

Tallaron et al.

[11] Patent Number: 4,721,865
[45] Date of Patent: Jan. 26, 1988

[54] ANALOG SIGNAL LEVEL DETECTOR

[75] Inventors: Louis Tallaron, Egreve; Jean C. Bertails, Coublevie, both of France

[73] Assignee: Societe pour l'Etude et la Fabrication de Circuits Integres Speciaux - Efcis, Grenoble, France

[21] Appl. No.: 777,303

[22] Filed: Sep. 18, 1985

[30] Foreign Application Priority Data

Sep. 21, 1984 [FR] France ............... 84 14567

[51] Int. Cl.[4] .................. H03K 5/153
[52] U.S. Cl. .................. 307/350; 307/354; 307/359; 328/151
[58] Field of Search ........... 307/351, 354, 359, 350, 307/358; 328/150, 151

[56] References Cited

U.S. PATENT DOCUMENTS

| 4,200,863 | 4/1980 | Hodges et al. | |
| 4,204,260 | 5/1980 | Nysen | 307/359 |
| 4,429,185 | 1/1981 | Adrian et al. | |
| 4,560,940 | 12/1985 | van der Schans | 307/359 |

FOREIGN PATENT DOCUMENTS 1254820 11/1971 United Kingdom .

OTHER PUBLICATIONS

IEE Journal of Solid State Circuits, vol. SC-10, No. 6, Dec. 1975.
Electronic Design, vol. 28, No. 2, Jan. 1980.
IBM Technical Disclosure Bulletin, vol. 25, No. 10, Mar. 1983.

Primary Examiner—John Zazworsky
Attorney, Agent, or Firm—Oblon, Fisher, Spivak, McClelland & Maier

[57] ABSTRACT

The invention relates to a detector of the mean level of a signal particularly intended to indicate whether an expected alternating signal is absent or present. This detector uses an analog comparator, a digital counter and a converter for establishing an analog signal to be compared with the expected rectified signal. The counter content oscillates round the mean value of the rectified signal. The counter serves as a digital integrator for the sign of the difference between the input signal and the content of the counter, in such a way that on average the input signal is just as often above as below the counter content. The digital - analog conversion can take place with the aid of switched capacitors.

6 Claims, 4 Drawing Figures

ANALOG SIGNAL LEVEL DETECTOR

BACKGROUND OF THE INVENTION

The present invention relates to an analog signal level detector.

The term level is here understood in its widest sense, because the applications envisaged for this detector essentially relate to knowing whether the expected signal is present or absent. The signal is expected, i.e. the range of its spectrum of frequencies is approximately known, together with its approximate amplitude, even if the range of possibilities is relatively wide. For example, a modem (modulator-demodulator) connected to a telephone line would recognise the presence of a call signal constituted by the carrier of known frequency.

Other similar or even relatively different applications can be envisaged. A voice activity detector in a speech analyzer could be useful for only initiating analysis operations in the presence of a signal manifesting the established existence of a voice activity with an adequate level.

Consequently the level detector in question can be a mean or average level detector of the rectified signal, without the mean or average word having to be taken in the strict mathematical sense. The object is to supply a signal recognizing the presence of an input signal if said mean value exceeds a predetermined threshold.

Such a detection requires a low-pass filtering, i.e. a certain signal integration with a time constant well above the variation period of the signal received. Without this there would be a risk of alternately detecting the presence and absence of the signal and each peak and each trough of the rectified alternating signal.

Thus, it is on the one hand necessary to rectify (preferably full-wave rectification) the signal to be detected and on the other make it undergo a certain integration.

Unfortunately, the integration of an analog signal with a relatively long time constant (e.g. 200 milliseconds for a 50 Hz signal) requires capacitors having relatively high values, which makes it difficult or even impossible to produce the signal detector in the form of an integrated circuit. For example for a modem, it is not only desirable for the detector to be in integrated form, but it is also desirable for it to form part of the same semiconductor chip as the actual modem.

SUMMARY OF THE INVENTION

The present invention proposes an analog signal level detector, which is particularly simple and requires no high value capacitor. This detector has the special feature of using as the integration element a digital reversible counter, which either carries out an up-count, or a down-count as a function of an analog-type comparison between the signal whose level is to be detected and the analog-type signal representing the counter content. Exceeding the level to be detected is determined on the basis of the counter content.

In the simplest case, the high order bit of the counter can be used to define whether a given mean level is exceeded.

The counting frequency is fixed and chosen in such a way that the counter content oscillates around a mean level with an oscillation amplitude which is low compared with this level. Thus, the counter content represents the mean level of the input signal.

The invention specifically relates to an analog signal level detector comprising a reversible counter, whose outputs supply a digital indication of the level of the analog input signal, an analog comparator, whose output is connected to one input of the counting direction of the counter, the counting direction being determined by the state of the comparator output, a means for establishing a difference or deviation signal, said means being connected to the outputs of the reversible counter and also receives the input signal to be detected, for establishing and applying to the comparator input a different signal representing the difference between the voltage level of the analog signal to be detected and a quantity proportional to the counter content, as well as a means for establishing a counting frequency for the counter, said frequency being such that the duration of the increase of the counter content from zero to its maximum value significantly exceeds the mean period of the signal to be detected.

In other words, a deviation or difference signal is established, whose positive or negative sign is detected by the comparator. If the sign is positive the counter will count up and if it is negative it will count down. In both cases, the counter content will vary slowly in one direction tending to reduce the amplitude of the difference signal. The counter acts as an integrator of the sign of the difference between its own content and the signal to be detected. As a result of this integration in the presence of a stable input signal, the counter content will undergo alternations of increase and decrease periods, in such a way that on average the sign of the difference signal will be positive just as often as it is negative. For an input signal constituted by a double alternation rectified sinusoid, it is possible to prove that the counter content then oscillates around a level representing the effective value of the input signal.

In the most general case, it is necessary to provide a rectifier (preferably a full wave rectifier) upstream of the detector input if the analog input signal to be detected is of an alternating type. However, it will be shown how, in a preferred embodiment of the invention, the rectifier can be eliminated, provided that account is taken of the sign of the input signal both for establishing the difference signal and for determining the counting direction.

In a simple embodiment, but requiring a rectifier upstream of the detector, the means for establishing the difference signal comprises a digital-analog converter, connected to the counter outputs. The counter output is applied to a comparator input, which also receives the rectified input signal on another input.

According to a preferred embodiment, the means for establishing the different signal comprises a system of switched capacitors having weighted respective values in accordance with the same binary weights as the outputs of the counter used for defining the different signal. A reference voltage source defines the ratio between the counter content and the quantity used for defining the different signals, i.e. the quantity compared with the analog input signal). A switching control circuit establishes the switching control signals, in accordance with a multiphase periodic cycle, and the counting frequency of the counter. Finally, a switching logic circuit controlled by the counter output and the switching control circuit, makes it possible to individually apply to each switched capacitor either the input signal, or the reference voltage, or an earth potential, as a function of conditions to be defined hereinafter.

The switched capacitors are connected to the comparator input and periodically establish thereon at the counting frequency of the counter, a potential which is the aforementioned difference signal. This potential is compared with zero by the comparator for defining the counting direction of the counter.

In principle, the switching cycle is as follows:

in a precharging phase, the capacitors are all charged with the input signal to be detected, then the store charges are isolated, a first plate of each capacitor is connected to the comparator input, whilst being maintained at a high impedance compared with any direct current supply;

in a comparison phase, the reference or earth potential is applied to the second plate of each capacitor, the choice of the potential applied to a given capacitor being fixed by the state of whichever of the counter inputs belongs to the same binary weight as the capacitor in question, the difference signal then appearing at the comparator output and is compared with zero.

In the preferred embodiment of the invention, there is no need for a rectifier upstream of the detector input, even for an alternating input signal as a result of introducing at each period a supplementary switching phase, which is a phase of determining the sign of the input signal. In this phase, which is in principle between the precharging phase and the leading phase, an earth potential is applied to the second plate of all the capacitors, so that during said phase the output of the comparator switches in one direction or the other as a function of the sign of the input voltage. This sign is stored in a flip-flop and is used, if negative, for modifying the establishment mode of the difference signal and the counting direction of the counter.

Thus, for example, if the detected and stored sign is negative, the reference voltage source (positive) is replaced by a negative reference source of the same value. At the same time, the counting direction determined by the comparator output following the reading phase is reversed compared with what it would be for a positive sign of the input signal (an EXCLUSIVE-OR gate controlled by the storage flip-flop of the sign is then inserted between the comparator output and the input of the counting direction of the counter).

In another embodiment, to obviate providing a negative reference voltage source, a supplementary capacitor is provided, whose value is equal to the sum of the values of the others. This capacitor is precharged to the reference voltage during the precharging phase. Then, during the reading phase, is applied thereto either the said reference voltage or the earth potential, depending on whether the stored sign is positive or negative. At the same time, if the stored sign is negative, there is a reversal of the choice between the reference potential of the earth potential applied to the switched capacitors during the reading phase. These two modifications amount to establishing a difference signal, which is not the difference between the input signal and the quantity proportional to the counter content, but is the difference between the inverse of the input signal and said quantity. Thus there is a full wave pseudo-rectification. It is then necessary to reverse the counting direction when the sign of the input signal is negative, as will be apparent from what is stated hereinafter.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
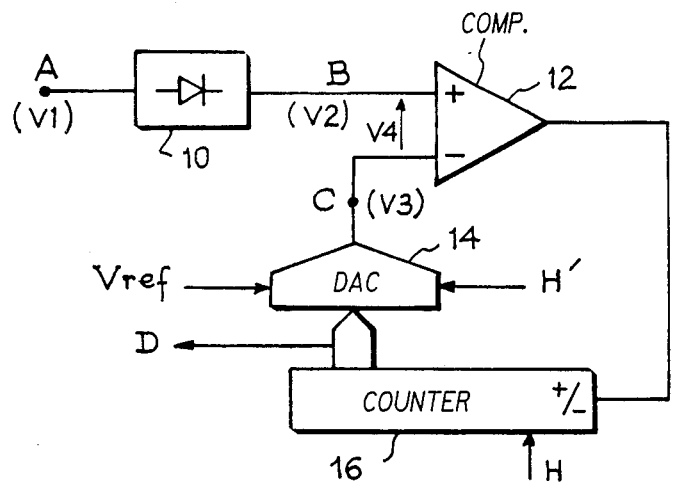
FIG. 1 the basic circuit according to the invention.
Figure 2:
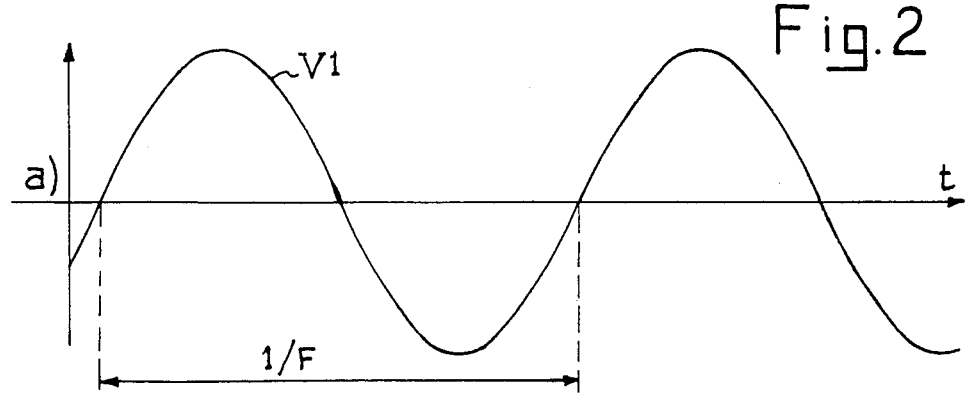
FIG. 2 a time diagram useful for the understanding of the operation of the diagram of FIG. 1.

FIG. 1 shows a simple embodiment of the detector according to the invention. In this embodiment, it is necessary to provide a preferably full wave rectifier 10, upstream of the detector input, if analog signal V1 whose level is to be detected is of an alternating type. Input A of rectifier 10 receives signal V1. Output B of the rectifier supplies a rectified signal V2. FIG. 2 shows for simplification purposes the input signal V1 in the form of a frequency sinusoid F, the signal V2 consequently having successive positive alternations.

Rectifier output B is connected to one input of a comparator 12 having another input C connected to the output of a digital-analog converter 14. The inputs of the latter are connected to the outputs of a reversible counter 16, whose counting up or down takes place at a frequency f defined by a clock signal H. The output of the converter 14 establishes on input C a voltage V3 representing the variations of the counter content. This voltage V3 varies in stepped manner in accordance with ramps which alternately increase, (when the counter counts up) and decrease (when the counter counts down), as can be seen in FIG. 2.

Thus, the circuit of FIG. 1 establishes the difference signal V4, which is the difference between voltages V2 and V3, and consequently between the rectified input signal and a quantity proportional to the counter content.

The output of comparator 12 is connected to a counting direction input of counter 16 and the state of this output determines the counting direction of the counter. If V2 exceeds V3, counter 16 will count up, whilst if V2 is below V3, the counter will count down. In both cases, the counting direction is such that the quantity V3 representing the content of the counter will tend to follow the rectified input signal V2.

However, the maximum increase slope of quantity V3 is voluntarily limited to the value such that in reality V3 cannot sufficiently rapidly follow signal V2.

For this purpose, the counting frequency f defined by clock H is such that the time taken by signal V3 for increasing from zero to its maximum (i.e. the time taken by the counter to pass from zero to its maximum) significantly exceeds the period 1/F of input signal V1. If the maximum content of the counter is Nmax, it is necessary for Nmax/f to be well above 1/F.

The amplitude of signal V3 is dependent on the digital/analog conversion scale in converter 14. A reference voltage Vref is used for defining this scale, Vref being the level reached by V3 when the counter content is at its maximum.

FIG. 1 also shows a second clock signal H' of the same frequency f as the signal H for periodically controlling the digital-analog conversion.

However, it must be ensured that the respective phases of the signals H and H' are such that the incrementation or decrementation of the counter does not take place at the time when the comparator 12 switches over.

In the presence of a sinusoidal alternating signal V1 of stable amplitude, it is found that the stepped signal V3 will weakly oscillate about a mean value. It is this mean value that the detector according to the present invention supplies to the user. For a full wave rectified sinusoidal input signal, said mean value represents the effective value of the input signal. For a random alternating signal, it can be simply stated that under stable operating conditions, the stepped signal oscillates triangularly (rising ramps and falling ramps) and the mean level of this triangular oscillation is established at a value such that on average the rectified signal V2 is just as frequently above as it is below the stepped signal V3.

This mean value can be obtained either in analog form at the output of converter 14, or in digital form at the output of counter 16 (output D). In a very simple case, only the high order bit of the counter will be used as the detector output. The value of voltage Vref is chosen as a function of a level threshold which it is wished to detect and it is ensured that the value of the high order bit of the counter defines the exceeding or non-exceeding of said threshold. A very simple case is that where the chosen threshold is Vref/2, whilst the maximum of the stepped signal V3 is Vref.

In connection with FIG. 1, it can also be stated that only a few high order bits of the counter can be used for application to the digital-analog converter, so that the stepped signal V3 will always have the same slope, but less steps.

Figure 3:
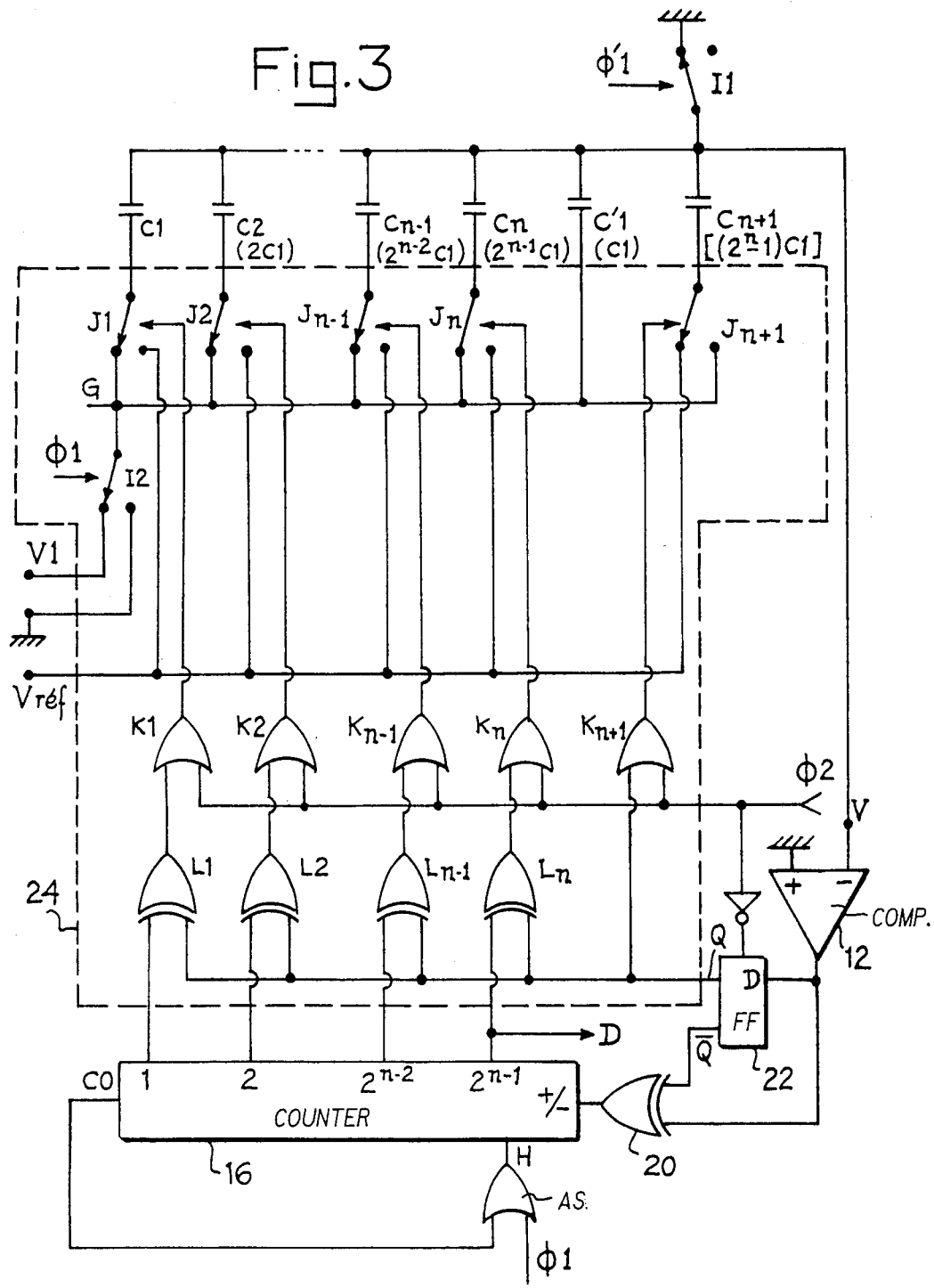
FIG. 3 a preferred embodiment of the invention.

FIG. 3 shows a preferred embodiment of the invention in which the difference signal is established by a group of switched capacitors (C1 to $C_n$). The circuit of FIG. 3 also comprises the reversible counter 16, having a counting direction input connected, via an EXCLUSIVE-OR gate 20, to the output of a comparator 12, whereof one input is connected to earth and whereof the other receives a difference signal (voltage V) representing the difference between the input signal and a quantity proportional to the counter content. It will be seen how the difference signal is periodically established by the group of switched capacitors. In this embodiment, voltage V is in reality the inverse of the aforementioned difference signal and it is applied to the inverting input of comparator 12.

The output of comparator 12 is also connected to the input of a flip-flop 22 for storing the sign of the input signal V1 to be detected. Thus, in this embodiment, input signal V1 can alternate about the earth potential, without it being necessary to provide a full wave rectifier. Comparator 12 periodically detects (at the counting frequency f) the sign of V1 and the outputs of flip-flop 22 store this sign. In this case output Q of flip-flop 22 is at 1 and output $\overline{Q}$ at O if the sign is positive and conversely if the sign is negative.

Output $\overline{Q}$ of flip-flop 22 is connected to an input of the EXCLUSIVE-OR gate 20 (whereof the other input receives the output of comparator 12), in such a way that if the sign detected during a counting period is positive, the counting direction input of the counter assumes a state which is that of the output of comparator 12 (counting up if voltage V is negative, counting down in the opposite case). If, on the other hand, the sign of V1 is negative, the EXCLUSIVE-OR gate 20 reverses the instruction given by the output of the comparator (counting down if voltage V is negative, counting up in the opposite case).

Capacitors C1 to $C_n$ all have a first plate connected to an inverting input (−) of the differential amplifier constituting comparator 12, whilst the other comparator input, which is non-inverting (+) is connected to earth.

The other plate of each capacitor C1 to $C_n$ is connected to a respective output of a logic switching circuit 24, which receives as signals to be switched on the one hand the input signal V1 and on the other an earth potential and finally a reference potential Vref.

Figure 4:
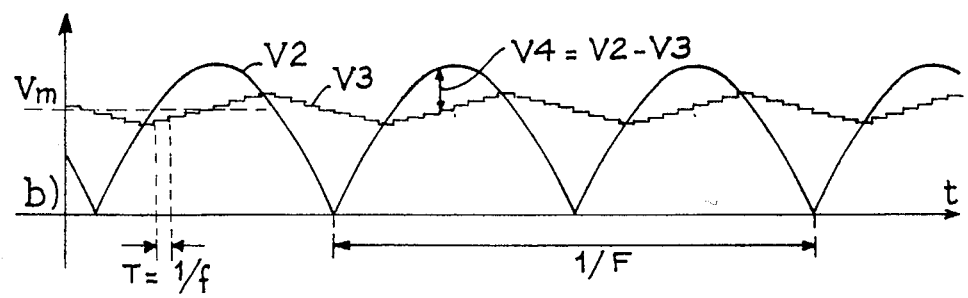
FIG. 4 a time diagram of the switching control signals used in the circuit of FIG. 3.
Figure 4:
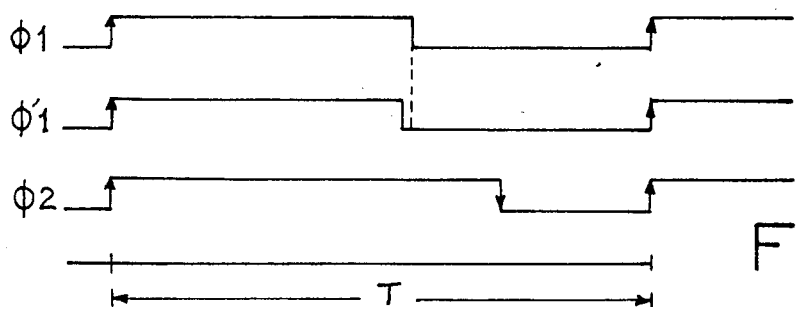

The switching circuit is controlled:

on the one hand by the outputs of counter 16, more specifically by those used for establishing the conversion of the content of the counter into an analog quantity proportional to said content, whereby in actual fact use is only made of n high order bits of the counter;

on the other hand, by a not shown switching control circuit, which establishes periodic, signals at the counting frequency f of counter 16, in accordance with a multiphase cycle shown in FIG. 4—essentially, two periodic square wave signals $\emptyset 1$ and $\emptyset 2$ of the same frequency are established, $\emptyset 1$ and $\emptyset 2$ passing through logic level 1 substantially at the same time and $\emptyset 2$ remaining at 1 longer than $\emptyset 1$, a signal $\emptyset' 1$ also being provided, which is identical to $\emptyset 1$ but passes to zero again slightly before $\emptyset 1$;

and finally by the output of the flip-flop 22 for storing the sign of V1, for modifying the switching operation as a function of the sign of V1.

Switching circuit 24 comprises a certain number of switching means and control gates (OR- and EXCLUSIVE-OR gates). Convention, in FIG. 3, the switches turn to the left of the drawing when the signal controlling them is at logic level 1 and towards the right when the signal controlling them is at level zero.

The various switches of the switching circuit are as follows:

A first switch I1, controlled by signal $\emptyset' 1$, makes it possible to connect to earth the first plate of capacitors C1 to $C_n(\emptyset 1 = 1)$, or to leave same at high impedance ($\emptyset' 1 = 0$).

A switch I2, controlled by signal $\emptyset 1$ makes it possible to apply to an intermediate point G of the circuit either input signal V1($\emptyset 1 = 1$), or the earth potential ($\emptyset 1 = 0$).

A series of switches J1 to $J_n$ make it possible to individually connect the second plate of each capacitor (C1 to $C_n$ respectively) either to point G or to the reference potential Vref. Each switch J1 to $J_n$ is controlled by the output of a respective OR-gate K1 to $K_n$, whereof one input receives the signal $\emptyset 2$ and the other input receives the output of a respective EXCLUSIVE-OR gate L1 to $L_n$. Said gate has an input connected to the output Q of flip-flop 22 and another input connected to a respective output taken from among the n high order outputs of the reversible counter 16.

Thus, each switched capacitor can be controlled by a respective output of the counter. The values of the capacitors are weighted in accordance with a binary progression corresponding to the weighting of the n highest order outputs of the counter, and capacitor of a given binary weight is controlled by the output of the counter of the same binary weight.

Capacitor C1 is controlled by the lowest order output of the counter. Capacitor $C_n$, controlled by the highest order output of the counter has the value $2^{n-1}C1$; capacitor $C_{n-1}$ has a value $2^{n-2}C1$ etc.

There is also a capacitor C'1 of the same value as C1, and directly connected, without switch, between the inverting input of comparator 12 and point G. Finally, a supplementary capacitor $C_{n+1}$ of value equal to the sum of the capacitors C1 to $C_n$, i.e. $(2^{n-1})$ C1 has a first plate connected like the other capacitors (C1 to $C_n$ and C'1) to the inverting input of comparator 12, has it second plate connected to a supplementary switch $J_{n+1}$ making it possible to connect it either to the reference potential Vref or to point G. This switch is controlled by an OR-gate $K_{n+1}$, whereof one input receives signal Ø2 and the other receives the output Q from the storage flip-flop 22 of the sign of V1.

In order to complete the description of FIG. 3, it is pointed out that the clock signal applied to the reversible counter for incrementing or decrementing it is from an OR gate 25 receiving on one input the signal Ø1 and on the other input an over flow output CO from the counter. This overflow output CO passes to 1 if the counter content reaches its maximum on counting up or its minimum on counting down. The counter increments or decrements during the rising fronts of signal Ø1 with probibition of exceeding the maximum or minimum.

Finally, flip-flop 22 has a triggering input receiving the signal Ø2 inverted by an inverter, in such a way that the possible switching (according to the state of the comparator output) takes place on the falling fronts of the square wave pulses Ø2.

The detailed operation of the circuit of FIG. 3 will now be described.

For each period defined by the switching control circuit it is possible to distinguish three main phases, namely a precharging phase in which Ø2 and Ø1 are at 1, a phase determining the sign V1 during which Ø1 is at zero and Ø2 still at 1, and a comparison phase during which both Ø1 and Ø2 are at zero.

(a) precharging phase:

the second plates of capacitors C1 to $C_n$ are connected to point G by switches J1 to $J_n$ because Ø2=1; point G receives the input voltage V1 by switch I2 because Ø1=1;

the second plate of the capacitor $C_{n+1}$ is connected to Vref because Ø2=1;

finally, the first plate of all the capacitors C1 to $C_n$, C'1 and C'$n_1$ is connected to earth by switch I1 because Ø1=Ø'1=1.

Capacitors C1 to $C_n$ and C'1 take the respective charges C1 V1, C2 V1, $C_n$ V1 and C'1 V1. Capacitors $C_{n+1}$ takes a charge $C_{n+1}$ Vref. In all the total charge present at the common point connecting the first plates of all the capacitors is $$-C1V1-C2V1\ldots-C_nV1-C'1V1-C_{n+1}\text{Vref}.$$

Just before the end of the precharging phase, i.e. just before Ø1 passes to zero, signal Ø'1 passes to zero opening switch I1 and isolating said overall charge on the input (high impedance) from comparator 12.

(b) phase of determining the sign of V1.

The switches are in the same position as in the precharging phase, except for I1 which is open and I2 which changes state and connects point G to earth.

As all the second plates of the capacitors are then at earth, except for $C_{n+1}$ which remains at Vref, the first plates pass to a potential −V1 as a result of the charge stored and isolated on the first plates, said potential −V1 then appearing on the inverting input of comparator 12. Comparator 12 then supplies a logic state 1 if V1 is positive and 0 if V1 is negative.

This state remains until the falling front of Ø2, which defines the end of the sign determination phase. On this falling front, input Q of flip-flop 22 assumes the state imposed by the output of the comparator and output $\overline{Q}$ assumes the complementary state. The state of the flip-flop is then maintained for a complete period.

(c) comparison phase

In all cases, switch I1 keeps in high impedance (isolation with respect to any direct current of comparator 12 and the first plates of the capacitors connected thereto). Switch I2 keeps point G at earth. It is necessary to distinguish two cases, as a function of whether V1 is positive or negative during the switching cycle in question.

1. V1 is positive.

Switch $J_{n+1}$ remains in its initial position because the OR gate $K_{n+1}$ transmits to it the output Q=1 of flip-flop 22.

The EXCLUSIVE-OR gates L1 to $L_n$ receiving a state 1 from flip-flop 22 then invert the states of the n highest order outputs of the reversible counter 16. The single OR gates K1 to $K_n$ transmit these inverted states to use as a control for switches J1 to $J_n$.

Thus, if the output of weight n is at 1, switch $J_n$ will switch over to connect the second plates of capacitor $C_n$ to Vref. Conversely, if said output is at zero, switch $J_n$ will not switch over and will leave the second plate of the capacitor $C_n$ connected to point G and consequently to earth. In the same way, the second plate of each capacitor C1 to $C_n$ is brought to Vref, if the output of corresponding weight is at 1 and is brought to zero if said output is at zero.

Thus, the common potential of the first plate of the switched capacitors will assume a value V, such that the sum of the charges of the different capacitors connected to the input of the comparator balances the initially stored charge, which is equal to:

$$-C1V1-C2V1-\ldots-C_nV1-C'1V1-C_{n+1}\text{Vref} \quad (1)$$

In order to calculate the sum of the charges of the capacitors, when a potential V is present on the first plate, it must be borne in mind that the capacitors have values weighted in accordance with the weight of the outputs of the counter, which now control the individual application of Vref or 0 to these capacitors $(C_n=2^{n-1}C1; C_{n+1}=2^{n-2}C1,$ etc.).

If n is the content of the counter, the word "content" being understood to mean here the content present in the highest order outputs only, the sum of the charges is then:

$$(C1+\ldots+C_n)V-N\text{ Vref}$$
$$C1+VC'1+(V-\text{Vref})C_{n+1} \quad (2)$$

The equality of terms (1) and (2) leads, whilst bearing in mind that $$C_{n+1}=C1+\ldots+C_n=(2^n-1)C1$$

and that C'1=C1:

$$V(2^{n+1}-1)C1=(N\text{ Vref}-V1\cdot 2^n)\text{ C1}$$

or $$V = \frac{-2^n}{2^{n+1} - 1}\left(V1 - \frac{N\,Vref}{2^n}\right) \quad (3)$$

Potential V which is established on the comparator input thus represents a difference signal as defined hereinbefore, namely a signal representing the difference between the input signal (V1) and a quantity proportional to the content N of the counter (N Vref/$2^n$).

Comparator 12 supplies a logic state 1 if the difference signal V1(N Vref/$2^n$) is positive and a state 0 if the signal is negative. This state defines the counter counting direction, which involves counting up if N Vref/$2^n$ is below V1 and counting down in the opposite case.

The incrementation or decrementation of the counter with the thus defined direction occurs on the rising front of signal ∅1, the end of the comparison phase and at the start of the precharging phase of the following period.

2. V1 is negative during the considered period.

It is then necessary to compare the quantity N Vref/$2^n$ representing the content of the counter with the absolute value of V1, i.e. with −V1.

It is therefore necessary to establish a difference signal −V1−N Vref/$2^n$, i.e. a potential V equal to $$\frac{-2^n}{2^{n+1} - 1}\left(-V1 - \frac{N\,Vref}{2^n}\right)$$

on the negative input of comparator 12. However, it is also possible to establish a potential $$V = \frac{-2^n}{2^{n+1} - 1}\left(V1 + \frac{N\,Vref}{2^n}\right)$$

and then reverse the counting up or down instruction given by the output of the comparator. This is what is done here, as will be seen, the inversion of the instruction taking place by the EXCLUSIVE-OR gate 20 controlled by the output $\overline{Q}=1$ of flip-flop 22.

On taking up again the operation carried out for the calculation of V with V1 positive, there is now a switching over of $J_{n+1}$ towards the position in which capacitor $C_{n+1}$ is connected to point G and consequently to earth.

The EXCLUSIVE-OR gates L1 to $L_n$ no longer invert the states of the N outputs of the counter. Thus, if the output of weight n is at 1, switch $J_n$ will switch over and will leave the second plate of capacitor $C_n$ connected to point G and consequently to earth. Conversely, if this output is at zero, the switch will switch over for connecting the capacitor $C_n$ to Vref. The same applies for the other capacitors C1 to $C_{n-1}$.

The common potential of the first plates will assume a value V, such that the sum of the charges of the different capacitors balances the initially stored charge, it being pointed out that it is equal to $$-C1V1 - C2V1 - \ldots$$
$$- - C_nV1 - C'1V1 - C_{n+1}Vref \quad (1)$$

Now, the sum of the charges of the capacitors is:

$$(C1+\ldots+C_n)V - (C1+\ldots+C_N)Vref + nVrefC1 + VC'1 + VC_{n+1} \quad (4)$$

The equality of the terms 1 and 4 leads to:

$$V(2^{n+1}-1)C1 = -N\,Vref\,C1 - 2^nV1$$

or $$V = \frac{-2^n}{2^{n+1} - 1}\left(V1 + \frac{N\,Vref}{2^n}\right) \quad (5)$$

which corresponds to what was sought, namely the establishment of a difference signal representing the difference between the rectified value (−V1) of the input signal V1 and the term N Vref/$2^n$ proportional to the counter content.

Thus, at the time of the rising front of 1, there is an incrementation of the counter if −V1 exceeds N Vref/$2^n$ and decrementation occurs in the opposite case.

As in the case of FIG. 1, the content of the counter will represent the mean level of the input signal V1. In the considered example, the highest order bit of the counter directly indicates whether the level is higher or lower then Vref/2, because N passes to $2^{n-1}$ when the highest order bit passes to 1, the unswitched capacitor C'1 equal to C1 is provided here for permitting this simple use of the highest order output of the counter in a very accurate manner. Otherwise several outputs can be used for defining a different level threshold.

Obviously, the slower the increase rate of N Vref/$2^n$, the lower the oscillation of the counter content around the mean detected value and the longer the time of establishing said mean value (in the same way as the zero return time in the case where the input signal disappears). It is therefore necessary to adopt a compromise on this point.

Reference is finally made to a pseudo-rectification of the input voltage in an embodiment with switched capacitors, like that of FIG. 3. If there is a negative reference voltage supply (−Vref), this can be used in place of Vref when flip-flop 22 indicates a negative sign of the input voltage. The capacitor $C_{n+1}$ or the EXCLUSIVE-OR gates L1 to $L_n$ are then eliminated because they are no longer necessary. Then in the same way, there is a comparison on V1 with N Vref/$2^n$, when V1 is positive and a comparison of −V1 with NVref/$2^n$ when V1 is negative.

What is claimed is:

1. An analog signal detector comprising:
   an up/down counter, said counter having a clock input, an up/down control input, and weighted outputs defining a content of the counter;
   clock means for applying to said clock input a clock signal having a frequency such that the duration of increase of the counter content from zero to its maximum value significantly exceeds the mean period of an analog signal to be detected;
   a comparator having an input and having an output for controlling said up/down control input of the counter;
   a group of switched capacitors each having a first and a second plate, said first plates being connected to the input of the comparator, and a switching control circuit for controlling the switching of said capacitors according to a periodic cycle at the clock signal frequency, said cycle having several phases, and said capacitors having respective values corresponding to the weighted outputs of the counter;

a reference voltage source;

a multiplexing circuit for applying to each individual capacitor either said analog signal to be detected, or the voltage of said voltage reference source, or an earth potential, said multiplexing circuit being controlled by the switching control circuit and by the outputs of the counter so that it assumes various configurations according to the following conditions:

(a) in a precharging phase of said periodic cycle, said capacitors each receive on their second plate the analog signal to be detected, while their first plate is connected to the earth potential;

(b) at the end of said precharging phase, the first plates are disconnected from the earth potential so as to avoid any loss of charges stored on these first plates during the precharging phase;

(c) in a comparison phase, the second plate of each respective capacitor is connected either to the reference voltage or to the earth potential, depending on whether that output of the counter which has the same weight as the respective capacitor has a value 0 or 1.

2. A detector according to claim 1, wherein said periodic cycle includes an additional phase for determining the sign of the analog signal, said detector comprising a register for storing a bit representing the determined sign, said register having an input connected to the output of the comparator, and having an output connected so as to control (a) a logical relation between the output of the comparator and the direction of counting of the counter (b) a logical relation between the outputs of the counter and the configuration of the multiplexing circuit.

3. A detector according to claim 2, wherein during the sign determination phase, one plate of each capacitor is connected to the earth potential, the other plate being connected to the comparator input, whilst retaining an overall isolation of the sum of the charges stored on the capacitors during the precharging phase.

4. A detector according to claim 3, wherein there are EXCLUSIVE-OR gates controlled by the said register and placed between the counter outputs and the multiplexing circuit.

5. A detector according to claim 4, wherein there is also an EXCLUSIVE-OR gate located between the output of the comparator and up/down control input of the counter, said gate being controlled by said register.

6. A detector according to claim 2, wherein an additional capacitor with a value equal to the sum of the others is connected between the comparator input and a switch controlled by said register and wherein during the precharging phase, to said capacitor is applied the reference potential and during the comparison phase is applied thereto either the reference potential, or the earth potential, according to whether the determined sign is positive or negative.

* * * * *